United States Patent
Huang et al.

(10) Patent No.: US 6,950,306 B2
(45) Date of Patent: Sep. 27, 2005

(54) CONNECTION FRAME FOR FAN

(75) Inventors: Wen-Shi Huang, Taoyuan (TW); Kuo-Cheng Lin, Taoyuan (TW); Chen-Chang Lin, Taipei (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/342,187

(22) Filed: Jan. 15, 2003

(65) Prior Publication Data
US 2003/0210526 A1 Nov. 13, 2003

(30) Foreign Application Priority Data
May 10, 2002 (TW) ....................................... 91206642 U

(51) Int. Cl.⁷ ........................... H01L 23/40; H05K 7/20
(52) U.S. Cl. ...................... 361/697; 361/710; 361/695; 257/706
(58) Field of Search .................. 361/690, 694–697, 361/702, 703, 709, 710; 257/705, 706, 707, 713, 717–719; 24/458, 297, 453, 457, 625; 248/510

(56) References Cited

U.S. PATENT DOCUMENTS

| 5,677,829 | A | * | 10/1997 | Clemens | 361/697 |
| 5,884,692 | A | * | 3/1999 | Lee et al. | 165/80.3 |
| 5,943,209 | A | * | 8/1999 | Liu | 361/695 |
| 6,017,185 | A | * | 1/2000 | Kuo | 415/177 |
| 6,330,905 | B1 | * | 12/2001 | Lin et al. | 165/80.3 |
| 6,343,013 | B1 | * | 1/2002 | Chen | 361/695 |
| 6,343,014 | B1 | * | 1/2002 | Lin | 361/697 |
| 6,392,885 | B1 | * | 5/2002 | Lee et al. | 361/697 |
| 6,449,151 | B1 | * | 9/2002 | Chen | 361/697 |
| 6,459,584 | B1 | * | 10/2002 | Kuo | 361/704 |
| 6,672,374 | B1 | * | 1/2004 | Lin | 165/121 |
| 2003/0136546 | A1 | * | 7/2003 | Zhang | |

FOREIGN PATENT DOCUMENTS

| TW | 331947 | 10/1986 |
| TW | 474557 | 1/2002 |

* cited by examiner

Primary Examiner—Anatoly Vortman
(74) Attorney, Agent, or Firm—Birch, Stewart, Kolasch & Birch, LLP

(57) ABSTRACT

A connection frame for fastening a fan of a heat sink is provided. The connection frame has side walls for defining an upper area and for mounting the fan thereon and a lower area to be coupled with the heat sink. The connection frame has a plurality of support struts on the lower area to wedge into the gaps of the fins of the heat sink for mounting the connection frame onto the heat sink. The connection frame further includes guiding parts extending from the side walls to reduce the airflow outlet so as to enhance the heat-dissipating efficiency.

20 Claims, 6 Drawing Sheets

CONNECTION FRAME FOR FAN

This nonprovisional application claims priority under 35 U.S.C. § 119(a) on Patent Application No. 091206642 filed in TAIWAN, R.O.C. on May 10, 2002, which is herein incorporated by reference.

FIELD OF THE INVENTION

The invention relates to a connection frame for a fan and particularly to a connection frame used for coupling the fan to a heat sink having a plurality of fins.

BACKGROUND OF THE INVENTION

Due to the requirements of high-speed data processing, manufacturing and design of central processing units (CPUs) are being improved constantly to further more powerful function and faster operating speed. Meanwhile, operating voltage and frequency are also increasing. As a result, the thermal generation power of CPUs is increasing significantly. Excessive high operation temperature affects the normal operation of the CPU. Hence good heat-dissipating devices are indispensable in computer systems. As the technology of the CPU improves, heat-dissipating devices also have to keep up with the CPU to meet its requirements.

The commonly used heat-dissipating devices at present include a heat sink and a fan. The heat sink has a body and a plurality of fins formed on the body. The body of the heat sink is contacted with the CPU for transmitting the heat generated from the CPU to the fins. The fins are designed to increase the heat dissipation area. The fan is mounted onto the heat sink to provide airflow to flow through the fins. The fins undergo heat exchange with the external air to dissipate heat.

At present time the assembly of the fan and the heat sink mostly adopts screws by which the periphery of the fan has corresponding apertures to receive screws so as to fasten the fan to the heat sink. There are two assembling methods. One approach is to omit the fins where the apertures are positioned (or the fins are spaced to form an accommodating area) to enable the screw to be directly fastened to the body of the heat sink. Such a construction requires a corresponding design for the fins (omitting the fins or forming a space between two fins) and thus increases production processes. In addition, to meet different heat-dissipating requirements, the heights of the fins are also different. Hence, different heat sinks require screw of different lengths. This creates many assembly problems. The other approach is to mount the fan onto the fins of the heat sink. The screw are directly fastened to the fins. However, the fins generally cannot withstand a great screwing force, and the fins are prone to deformation when the screw are fastened. As a result, supporting the fan is difficult or even impossible.

SUMMARY OF THE INVENTION

The primary object of the invention is to provide a connection frame for fastening a fan to a heat sink having a plurality fins.

The connection frame of the invention is located between the fan and the heat sink to enable the fan to be fastened to the heat sink through screw. The connection frame includes a seat with an opening formed in the center to allow the airflow generated by the fan to pass through. The periphery of the seat has a plurality of apertures for the screw to through. The bottom section of the seat corresponding to the apertures has a plurality of support struts. The support struts may be wedged into the gaps of the fins and rest on the tops of the fins. Then the screw may be fastened into the fins to anchor the fan onto the heat sink.

Another object of the invention is to provide a connection frame for guiding the airflow of the fan so as to effectively increase the heat-dissipating efficiency.

According to the connection frame of the invention, the seat has guiding parts formed on two sides thereof. The guiding parts cover a portion of airflow outlet of the fins so that the airflow may be converged to flow to the center and the bottom section before being discharged, thereby increasing heat-dissipating efficiency.

The foregoing, as well as additional objects, features and advantages of the invention will be more readily apparent from the following detailed description, which proceeds with reference to the accompanying drawings.

DESCRIPTION OF THE PREFERRED EMBODIMENT

The connection frame of the invention is mounted onto the fins of a heat sink for fastening the fan onto the heat sink through screws. In general, there are many ways to fasten fan to the heat sink, such as screw fastening, latch ledge and snap hook, etc. In terms of mechanical design, screw fastening still is the simplest method with the greatest bonding strength. It is the most reliable method and has the lowest cost. However, due to growing demands for heat-dissipation, the fins of the heat sink are becoming increasingly thinner. It has become very difficult to directly fasten the screws to the fins. The connection frame of the invention aims at overcoming this problem.

Figure 2:
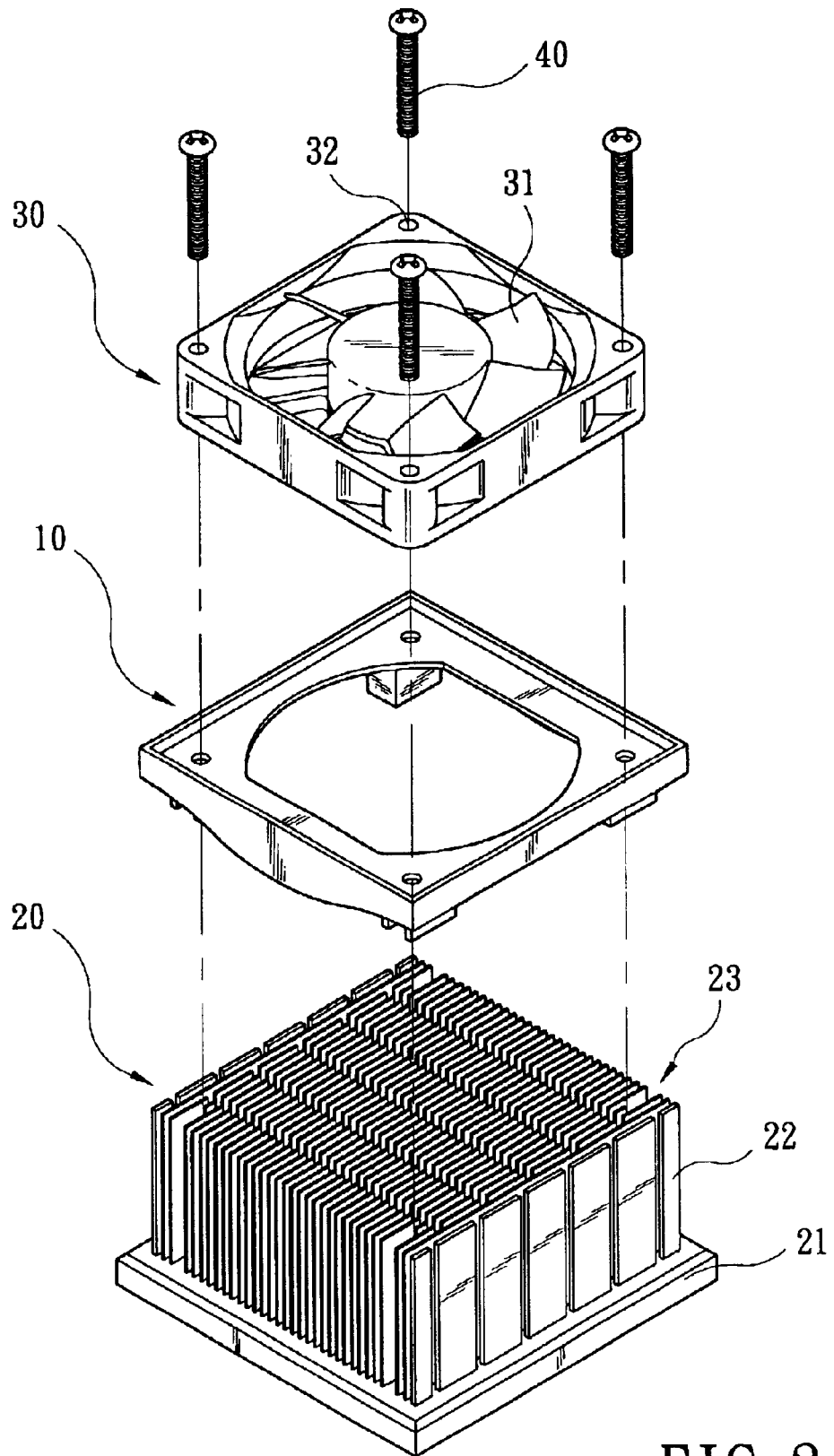
FIG. 2 is an exploded view of heat-dissipating assembly of the invention.

Please refer to FIG. 2 which shoes a preferred embodiment of the heat-dissipating of the heat-dissipating assembly of the present invention. To dissipate heat from a heat source (such as a CPU), at least one heat sink 20 and one fan 30 are required. The heat sink 20 is mounted on a CPU (not shown in the drawing) for transmitting the heat generated from CPU. The fan 30 provides airflow flowing through the heat sink 20 to dissipate heat. The heat sink 20 includes a body 21 and a plurality of fins 22 located on the body 21. The fins 22 have a plurality of fastening sections 23 to engage with screws 40. In addition, the fan 30 has a plurality blades 31 to generate airflow and a plurality of apertures 32 for fastening use (these are known in the art, thus the details are omitted).

Figure 1A:
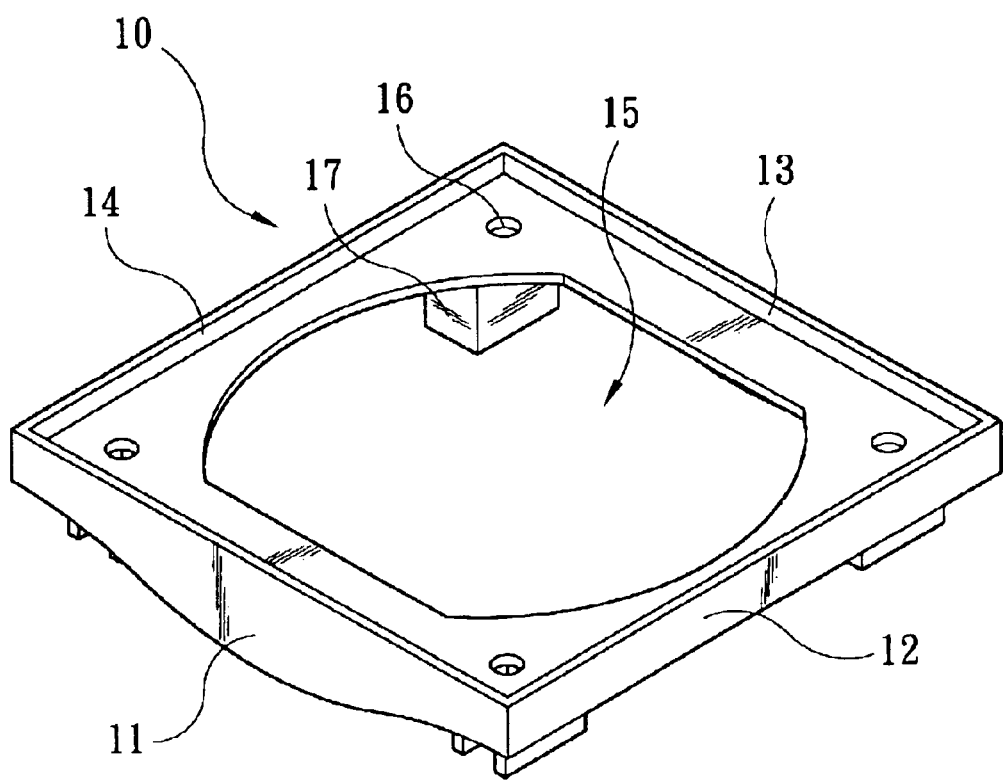
FIGS. 1A and 1B are schematic diagrams of the connection frame of the invention.
Figure 1B:
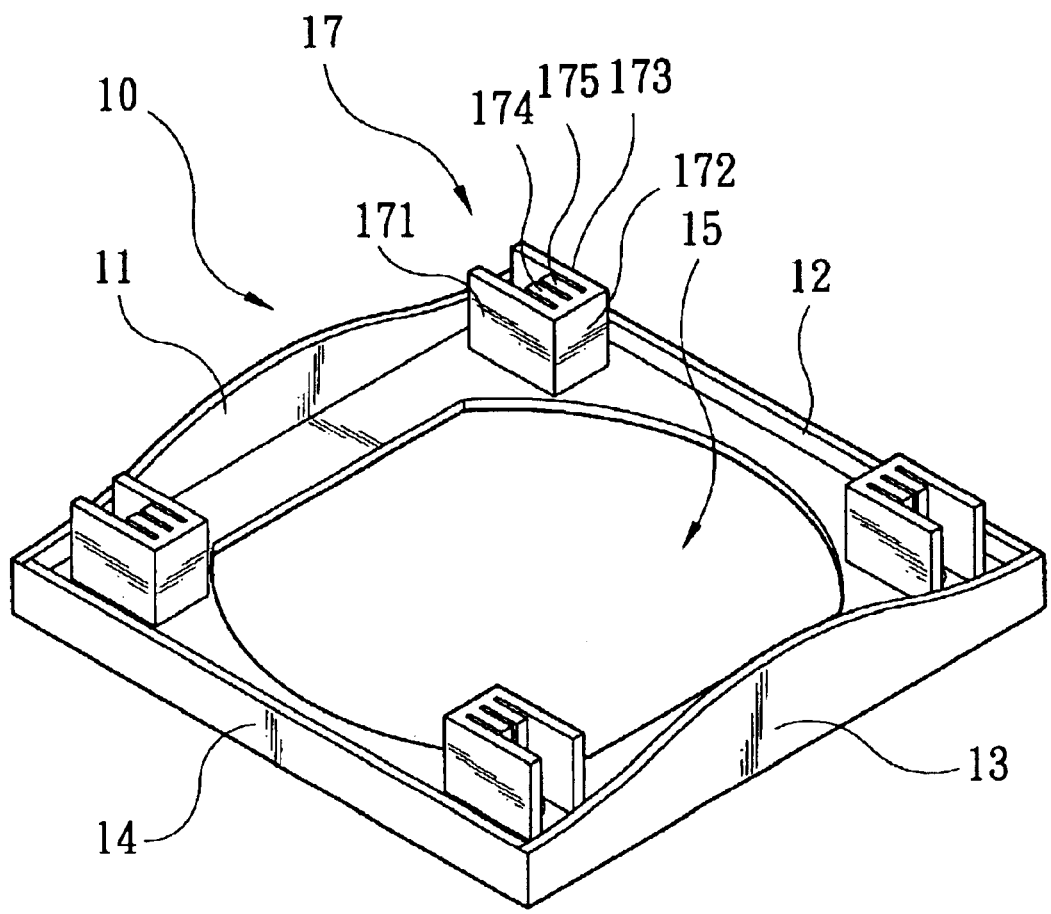

Referring to FIGS. 1A and 1B, the connection frame of the invention includes a seat 10, which is substantially formed in a square shape with four side walls 11, 12, 13 and 14 extending vertically upwards and downwards. The side walls 11, 12, 13 and 14 define an upper area to support the fan 30 and a lower area to couple with the fins 22 of the heat sink 20. The seat 10 has an opening 15 formed in the center with a size substantially the same as the outside diameter of the blades 31 of the fan 30 so that the airflow generated by the fan 30 may pass through the opening 15. The periphery of the seat 10 has a plurality of apertures 16 corresponding to the fastening sections 23 of the fins 22 to enable the screws 40 to run through and fasten to the fastening sections 23.

The seat 10 further has a plurality of support struts 17 formed on the lower area corresponding to the apertures 16. Each support strut 17 has three outer walls 171, 172 and 173 formed in a U shape with the opening facing outwards. The outer walls 171, 172 and 173 may be wedged into the gaps between the fins 22. The distance between the two adjacent outer walls 171 and 173 is equal to the interval of three fins 22. Inside each support strut 17 there are two inner ledges 174 and 175 formed in the gaps between the outer walls 171 and 173 to be wedged into the fin 22.

Figure 3:
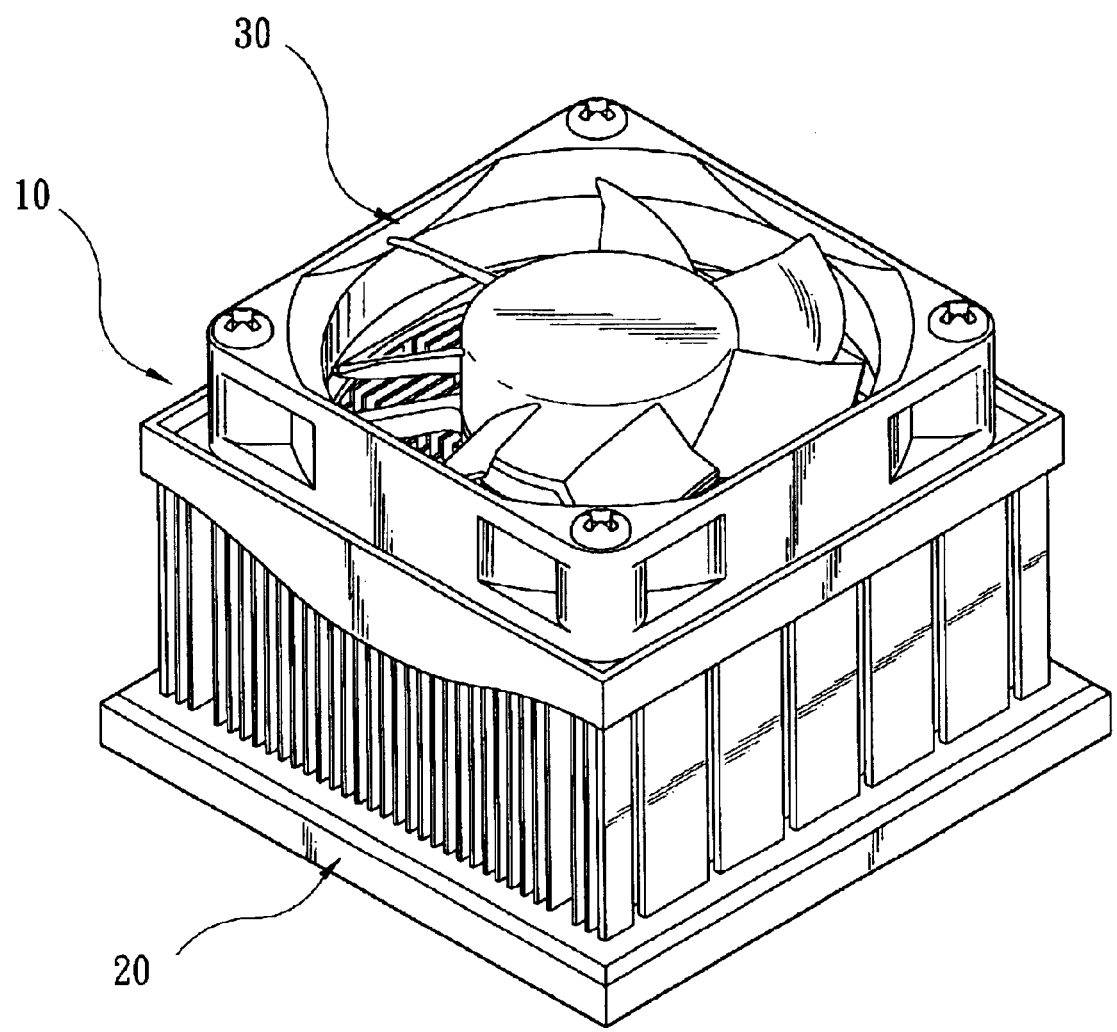
FIG. 3 is perspective view of the heat-dissipating assembly of FIG. 2 after assembled.
Figure 4:
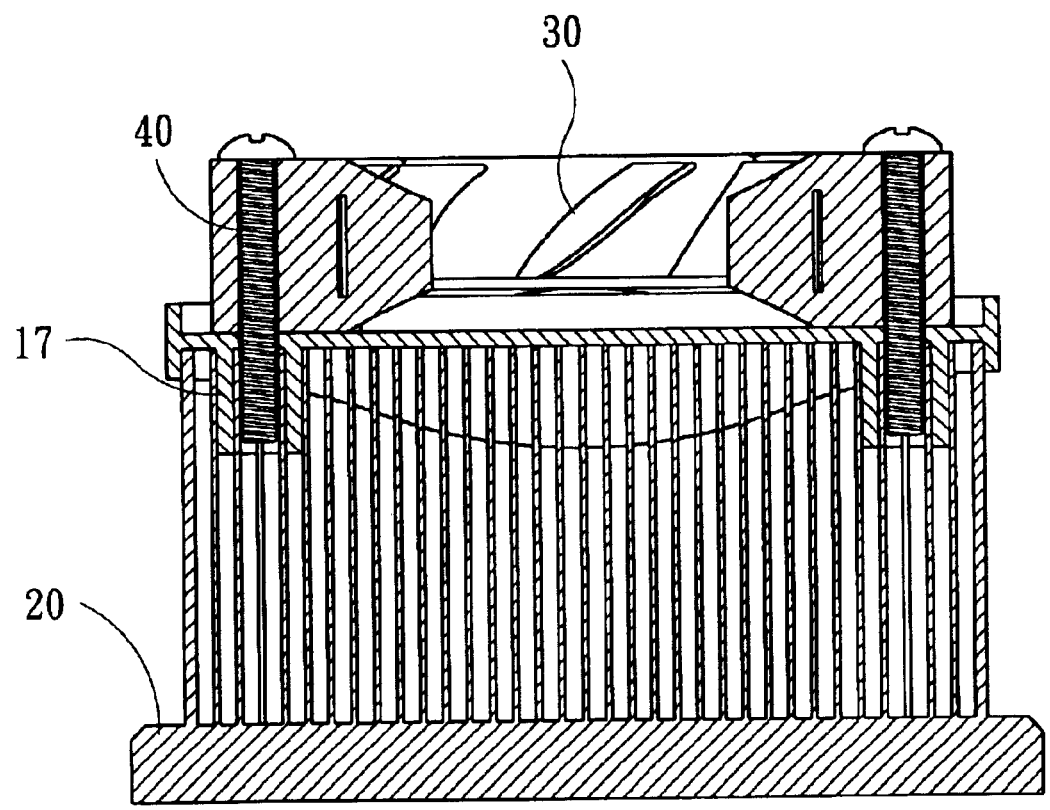
FIG. 4 is a cross section of the FIG. 3.

Referring to FIGS. 2, 3 and 4, the connection frame of the invention is located between the fan 30 and the heat sink 20 to enable the fan 30 to be fastened to the heat sink 20 by means of the screws 40. The seat 10 is mounted onto the heat sink 20 with the support struts 17 wedged into the screwing sections 23 of the fins 22. The outer walls 171 and 173 are wedged into the outer gaps of the three fins 22. The inner ledges 174 and 175 are wedged into the gaps of the fins 22 located on two sides of the screwing section 23. Hence, the fins 22 in the screwing section 23 are coupled with the support struts 17 and their top ends hold the support struts 17. Therefore, the supporting power of the fins 22 in the screwing section 23 increases. When assembling the fan 30 with the seat 10, the screws 40 may run through the fastening holes 32 of the fan 30 and the apertures 16 of the seat 10 in order to engage with the screwing section 23. As the top ends of the fins 22 in the screwing section 23 support the support struts 17, the screws 40 may be fastened smoothly to the screwing section 23 to anchor the fan 30 onto the fins 22 of the heat sink 20. The airflow generated by the fan 30 may pass through the opening 15 and flow into the fins 22 to process heat exchange and achieve of objective of heat dissipation.

Figure 5:
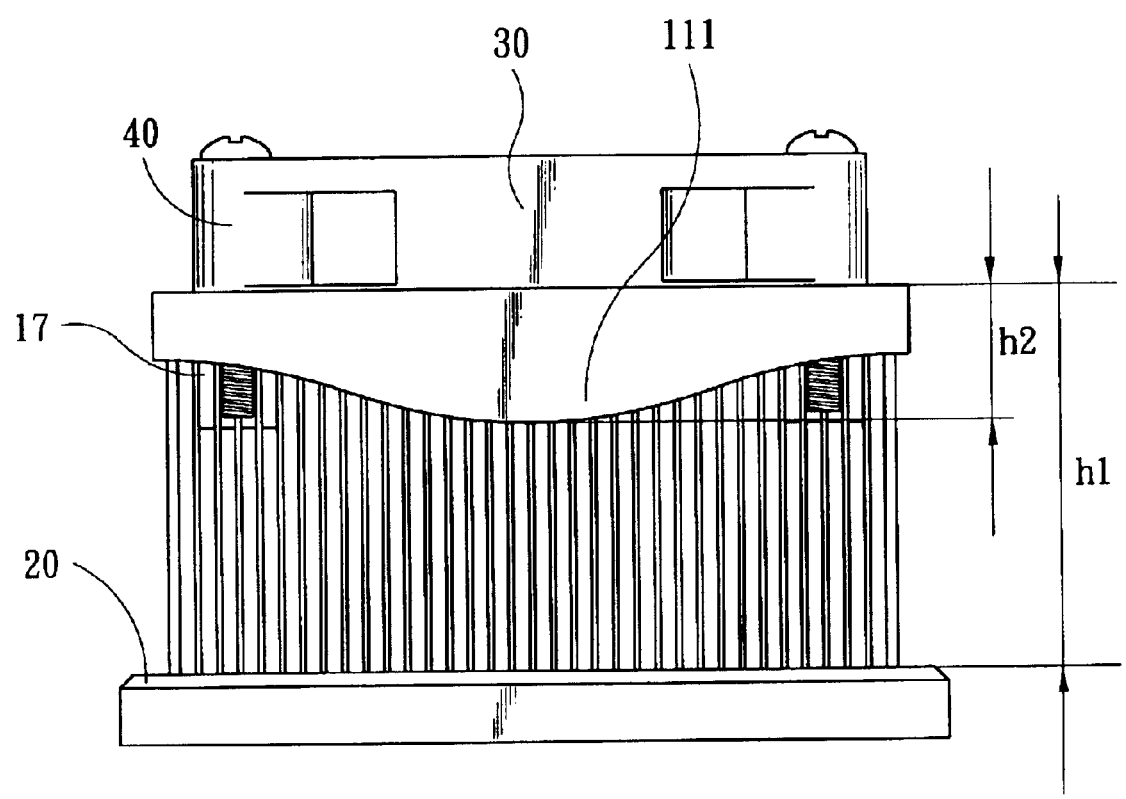
FIG. 5 is a side view of the FIG. 3.

The connection frame of the invention enables the fan 30 to be directly fastened to the heat sink 20 with thin fins 22 by means of the screws 40. As the heat sink 20 has a larger heat-dissipating area, it has a better radiation effect. Referring to FIG. 5, the side walls 11 and 13 at two sides of the seat 10 corresponding to airflow outlets may be extended downwards to form guiding parts 111 to partially cover the airflow outlets and make the airflow outlets smaller. As a result, airflow speed becomes faster. And air may flow to the bottom section of the fins 22 before being discharged. Thus heat-dissipating efficiency may be improved. As the CPU is generally contacted with the center portion of the body of the heat sink 20 where the generated heat is concentrated, the guiding parts 111 are preferably positioned on the middle section of the side wall extending downwards to partially cover the heat sink so as to reduce the outlets. Such a design can concentrate more airflow in the center and accelerate the flow rate to achieve the optimal heat-dissipating effect. Moreover, the heat sink 20 of different specifications have different heights for the fins 22. Depending on the heights of the fins 22, the downward extension length of the guiding parts 111 may be adjusted. The covered height of the fins 22 is preferably ½ or ⅓ of the total height of the fins 22. As shown in FIG. 5, if the height of the fins 22 is h1, the height of the guiding part is h2, h1:h2=1:½, or h1:h2=1:⅓.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A connection frame securing a fan onto a heat sink having a plurality of fins, comprising a seat having an opening to allow airflow generated by the fan to pass through, a plurality of apertures formed on a periphery thereof for fastening the fan to the seat, and a plurality of support struts located corresponding to the apertures and being wedged into gaps formed on the fins for securing the connection frame to the heat sink.

2. The connection frame of claim 1, wherein the support strut includes outer walls forming in a U shape to be wedged in the gaps of the fins.

3. The connection frame claim 1, wherein the support strut includes two inner ledges to be wedged into the gaps between adjacent fins located inside the outer walls.

4. The connection frame of claim 1, wherein the seat has side walls extending vertically upwards and downwards, for defining an upper area for supporting the fan and a lower area to coupled with the fins of the heat sink.

5. The connection frame of claim 4, wherein a portion of the side walls further include guiding parts for partially covering the airflow outlets.

6. The connection frame of claim 5, wherein each of the guiding parts is formed in the middle section of the side wall and extending downwards.

7. The connection frame of claim 6, wherein the guiding parts a extended downwards to a length to cover less than ½ or ⅓ of the height of the fins.

8. The connection frame of claim 6, wherein the guiding part are extended downwards to a length no greater than ½ or ⅓ of the height of the fins.

9. A connection frame adapted to be disposed between a fan and a heat sink having a plurality of fins, the connection frame comprising a seat having side walls, an opening to allow airflow generated by the fan to pass through, and a plurality of apertures formed on the periphery thereof, wherein one of the side walls has a guiding part for partially covering the outlets of the airflow to accelerate the airflow rate and wherein the aperture receive attachments for connecting the heatsink, connector frame and the frame directly, wherein the connection frame has a plurality of support struts positioned on a lower area and extending downwards to be wedged with the fins of the heat sink.

10. The connection frame of claim 9, wherein the attachments are a plurality of screws.

11. The connection frame of claim 9, wherein the guiding part is formed in the middle section of the side wall and extending downwards.

12. The connection frame of claim 11, wherein the guiding part is extended downwards to a length to cover less than ½ or ⅓ of the height of the fins.

13. The connection frame of claim 11, wherein the guiding part is extended downwards to a length no greater than ½ or ⅓ of the height of fins.

14. A heat-dissipating assembly adapted to be used with a heat source comprising:
    a first heat-dissipating device attached to the heat source;
    a second heat-dissipating device; and
    a connection frame for coupling the first heat-dissipating device to the second heat-dissipating device, wherein the connection frame has a side wall to define an upper area for mounting the second heat-dissipating device thereon, and a lower area for securing the connection frame to the first heat-dissipating device, wherein the connection frame has a plurality of support struts positioned on the lower area and extending downwards to be wedged with fins of the first heat-dissipating device; and attachments extending through the connection frame and spaced from the side wall of the frame, the connection frame being affixed directly to the first-heat dissipating device and the second heat-dissipating device by the attachments and the side wall of the connection frame being freely movable relative to the second heat dissipating device when the attachments are absent.

15. The heat-dissipating assembly of claim 14, wherein the connection frame further has at least one guiding parts extending downwards from the side wall to partially cover an outlet of airflow generated from the second heat-dissipating device, the heat-dissipating device having fins.

16. The heat-dissipating assembly of claim 15, wherein the guiding part is extended downwards to a length to cover less than ½ or ⅓ of the height of the fins.

17. The heat-dissipating assembly of claim 15, wherein the guiding part is extended downwards to a length no greater than ½ or ⅓ of the height of the fins.

18. The heat-dissipating assembly of claim 14, wherein the connection frame further includes an opening for allowing airflow generated by the second dissipating device to pass there through and toward the first heat-dissipating device to dissipate heat generated by the heat source.

19. The heat-dissipating assembly of claim 14, wherein the attachments are screws.

20. A heat-dissipating assembly adapted to be used with a heat source comprising:

a first heat-dissipating device attached to the heat source comprising fins;

a second heat-dissipating device; and a connection frame for coupling the first heat-dissipating device to the second heat-dissipating device, wherein the connection frame has an upper area for mounting the second heat-dissipating device thereon, a lower area for securing the connection frame to the first heat-dissipating device, and a plurality of support struts positioned on the lower area and extending downwards to be wedged with the fins of the first heat-dissipating device.

* * * * *